US 6,646,470 B2

(12) United States Patent
Fulkerson

(10) Patent No.: US 6,646,470 B2
(45) Date of Patent: *Nov. 11, 2003

(54) HIGH SPEED OUTPUT BUFFERS USING VOLTAGE FOLLOWERS

(75) Inventor: David E. Fulkerson, Chanhassen, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/147,662

(22) Filed: May 15, 2002

(65) Prior Publication Data

US 2002/0180482 A1 Dec. 5, 2002

Related U.S. Application Data

(63) Continuation of application No. 09/710,170, filed on Nov. 9, 2000, now Pat. No. 6,469,543.

(51) Int. Cl.[7] ............................................. H03K 19/003
(52) U.S. Cl. .............................. 326/83; 326/26; 326/82; 327/108; 327/315; 327/561
(58) Field of Search ............................ 326/26, 82, 83, 326/30; 327/108, 170, 552, 532, 538, 374, 380

(56) References Cited

U.S. PATENT DOCUMENTS

| 5,656,947 | A |   | 8/1997  | Opris |
| 5,825,238 | A | * | 10/1998 | Poimboeuf et al. ......... 327/552 |
| 5,939,909 | A |   | 8/1999  | Callahan, Jr. |
| 5,966,086 | A |   | 10/1999 | Kubo et al. |
| 6,107,985 | A | * | 8/2000  | Walukas et al. ............ 345/102 |
| 6,255,877 | B1 | * | 7/2001 | Thomasson ................ 327/237 |

* cited by examiner

Primary Examiner—Michael Tokar
Assistant Examiner—Vibol Tan
(74) Attorney, Agent, or Firm—Schiff Hardin & Waite

(57) ABSTRACT

An output buffer is provided in the form of a voltage follower having a positive input that receives a reference voltage, a negative input and an output coupled together, and a control input that turns the voltage follower on and off. The output is coupled to one side of a load. The output buffer may have one or more additional voltage followers. For example, the output buffer may include three additional voltage followers with all voltage followers arranged as a low voltage differential signal (LVDS) buffer.

8 Claims, 5 Drawing Sheets

HIGH SPEED OUTPUT BUFFERS USING VOLTAGE FOLLOWERS

RELATED APPLICATIONS

This application is a continuation of U.S. patent application Ser. No. 09/710,170 filed on Nov. 9, 2000 now U.S. Pat. No. 6,469,543.

GOVERNMENT RIGHTS

The U.S. Government has a paid-up license in this invention and the right in limited circumstances to require the patent owner to license others on reasonable terms as provided for by the terms of a contract F29601-98-C-0163 awarded by the Air Force.

TECHNICAL FIELD OF THE INVENTION

The present invention relates generally to output buffers and, more particularly, to output buffers using voltage followers.

BACKGROUND OF THE INVENTION AND PRIOR ART

Output buffers are used for a variety of reasons including isolating loads from input voltages. An example of a known output buffer 10 is shown in FIG. 1. The output buffer 10 includes first and second insulated gate field effect transistors 12 and 14 connected in series between a source and ground. The output buffer 10 also includes third and fourth insulated gate field effect transistors 16 and 18 connected in series between the source and ground. The gates of the second and third insulated gate field effect transistors 14 and 16 receive an input signal IN, and the gates of the first and fourth insulated gate field effect transistors 12 and 18 receive an inverted form of the input signal IN. A load 20 is coupled between the junction of the first and second insulated gate field effect transistors 12 and 14 and the junction of the third and fourth insulated gate field effect transistors 16 and 18. As shown in FIG. 1, the load 20 includes a resistor 22 and a capacitor 24, where the resistor 22 represents a transmission line and its terminating resistor, where the capacitor 24 represents the capacitance of the line, and where the resistor 22 and the capacitor 2 are shown in parallel.

There are several problems associated with the output buffer 10. For example, the charging current provided by the output buffer 10 is "passive" in nature. That is, the maximum current required to charge the capacitor 24 is limited to the current required for the prescribed voltage across the resistor 22. In the case of a low voltage differential signal (LVDS) buffer, this current may be 3.5 ma, for example. Because the speed of the output buffer 10 is dependent upon this charging current, the speed of the output buffer 10 is limited due to the limited charging current. Another problem with the output buffer 10 is that it produces objectionable ringing when driving inductance loads. Still another problem is that the differential voltage swing and the mid-point output voltage of the output buffer 10 are set by either a current source or a resistor which limits the accuracy of the output buffer 10.

The present invention is directed to an output buffer which addresses one or more of these problems.

SUMMARY OF THE INVENTION

In accordance with one aspect of the present invention, an output buffer comprises a voltage follower having a positive input, a negative input and an output coupled together, and a control input arranged to control an operational state of the voltage follower. The positive input is a reference voltage input of the voltage follower, and the output of the voltage follower is a load output of the voltage follower.

In accordance with another aspect of the present invention, an output buffer comprises first, second, third, and fourth voltage followers. The first voltage follower has a first positive input, a first negative input and a first output coupled together, and a first control input arranged to control an operational state of the first voltage follower. The first positive input is a reference voltage input of the first voltage follower, and the output of the first voltage follower is a load output of the first voltage follower. The second voltage follower has a second positive input, a second negative input and a second output coupled together, and a second control input arranged to control-an operational state of the second voltage follower. The second positive input is a reference voltage input of the second voltage follower, and the output of the second voltage follower is a load output of the second voltage follower. The third voltage follower has a third positive input, a third negative input and a third output coupled together, and a third control input arranged to control an operational state of the third voltage follower. The third positive input is a reference voltage input of the third voltage follower, and the output of the third voltage follower is a load output of the third voltage follower. The fourth voltage follower has a fourth positive input, a fourth negative input and a fourth output coupled together, and a fourth control input arranged to control an operational state of the fourth voltage follower. The fourth positive input is a reference voltage input of the fourth voltage follower, and the output of the fourth voltage follower is a load output of the fourth voltage follower.

In accordance with still another aspect of the present invention, an output buffer system comprises a voltage follower, a reference voltage, and a load. The voltage follower has a positive input coupled to the reference voltage, a negative input and an output coupled together, and a control input that controls an operational state of the voltage follower. The output of the voltage follower is coupled to one side of the load.

BRIEF DESCRIPTION OF THE DRAWINGS

These and other features and advantages will become more apparent from a detailed consideration of the invention when taken in conjunction with the drawings in which.

DETAILED DESCRIPTION

Figure 2:
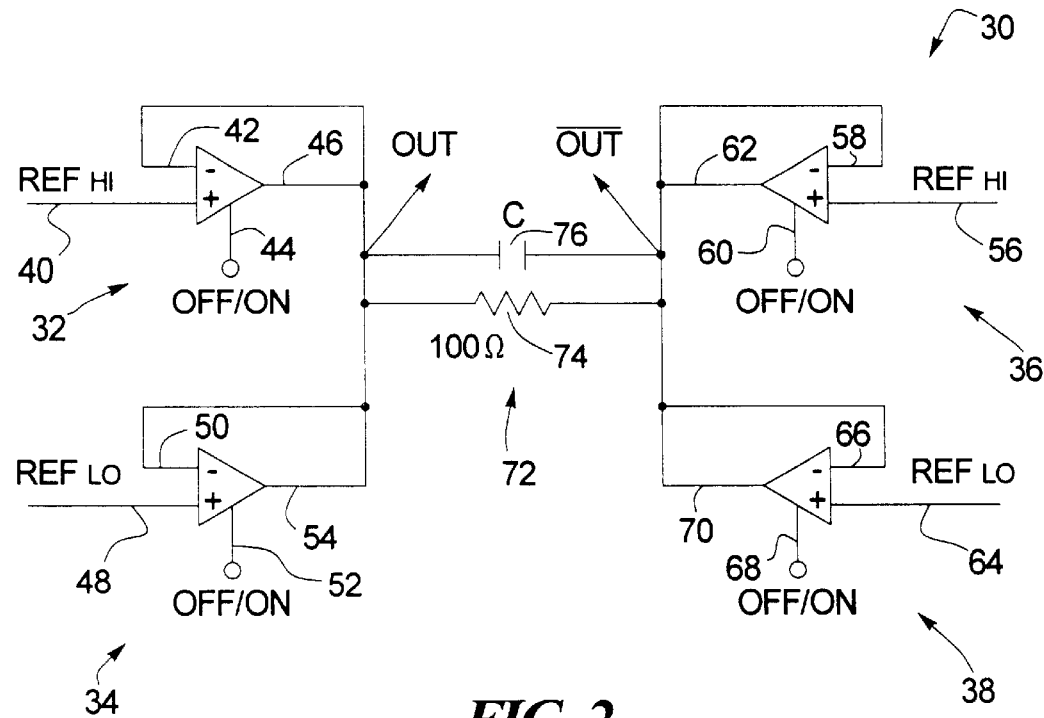
FIG. 2 is a schematic diagram of an output buffer using voltage followers according to a first exemplary embodiment of the present invention.

An output buffer 30 according to a first exemplary embodiment of the present invention is shown in FIG. 2. The output buffer 30 includes first, second, third, and fourth voltage followers 32, 34, 36, and 38. The voltage follower 32 is shown in FIG. 2 as an amplifier having a positive input 40, a negative input 42, a control input 44, and an output 46. The positive input 40 receives a reference voltage $REF_{HI}$, the output 46 is coupled back to the negative input 42, and the control input 44 controls the on/off state of the voltage follower 32.

The voltage follower 34 is shown as an amplifier having a positive input 48, a negative input 50, a control input 52, and an output 54. The positive input 48 receives a reference voltage $REF_{LO}$, the output 54 is coupled back to the negative input 50, and the control input 52 controls the off/on state of the voltage follower 34.

The voltage follower 36 is shown as an amplifier having a positive input 56, a negative input 58, a control input 60, and an output 62. The positive input 56 receives the reference voltage $REF_{HI}$, the output 62 is coupled back to the negative input 58, and the control input 60 controls the off/on state of the voltage follower 36.

The voltage follower 38 is shown as an amplifier having a positive input 64, a negative input 66, a control input 68, and an output 70. The positive input 64 receives the reference voltage $REF_{LO}$, the output 70 is coupled back to the negative input 66, and the control input 68 controls the on/off state of the voltage follower 38.

Figure 1:
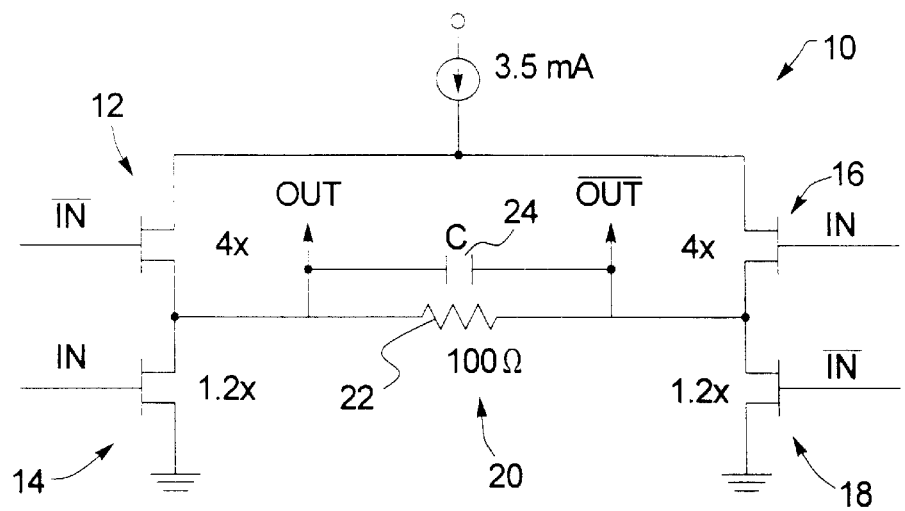
FIG. 1 is a schematic diagram of a known output buffer.

The outputs 46 and 54 of the voltage followers 32 and 34 are coupled together and to one side of a load 72, and the outputs 62 and 70 of the voltage followers 36 and 38 are coupled together and to the other side of the load 72. As in the case of the output buffer 10 shown in FIG. 1, the load 72 includes a resistor 74 and a capacitor 76, where the resistor 74 represents a transmission line and its terminating resistor, where the capacitor 76 represents the capacitance of the transmission line, and where the resistor 74 and the capacitor 76 are shown in parallel. Loads other than the load 72 can be used with the output buffer 30.

The reference voltage $REF_{HI}$ on the positive inputs 40 and 56 of the voltage followers 32 and 36 may be set at a higher voltage level than the reference voltage $REF_{LO}$ on the positive inputs 48 and 64 of the voltage followers 34 and 38, although this relationship could be reversed. Exemplary values for the reference voltage $REF_{HI}$ and the reference voltage $REF_{LO}$ may be 1.375 volts and 1.025 volts, respectively. These voltages are particularly suited for low voltage differential signal buffers. However, the reference voltage $REF_{HI}$ and the reference voltage $REF_{LO}$ for low voltage differential signal buffers may be set at other suitable voltage levels. Also, the reference voltage $REF_{HI}$ and the reference voltage $REF_{LO}$ may be set at other voltage levels for other types of buffers, as appropriate.

Figure 3:
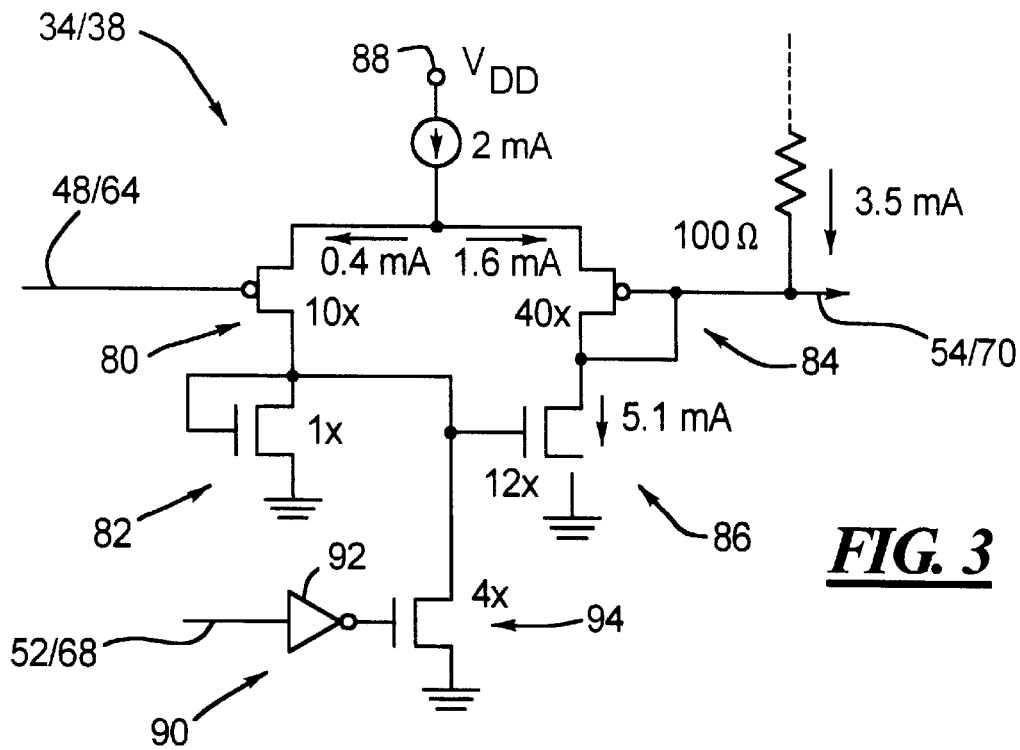
FIGS. 3 and 4 illustrate exemplary detailed embodiments of the voltage followers of the output buffer shown in FIG. 2.

The voltage follower 34, which may be implemented in CMOS, is shown in more detail in FIG. 3 and includes a field effect transistor 80 and an insulated gate field effect transistor 82 in the CMOS N channel and a field effect transistor 84 and an insulated gate field effect transistor 86 in the CMOS P channel. The source terminal of the field effect transistor 80 is coupled to a source 88, the drain terminal of the field effect transistor 80 is coupled to the source terminal of the insulated gate field effect transistor 82, and the drain terminal of the insulated gate field effect transistor 82 is coupled to ground. Similarly, the source terminal of the field effect transistor 84 is coupled to the source 88, the drain terminal of the field effect transistor 84 is coupled to the source terminal of the insulated gate field effect transistor 86, and the drain terminal of the insulated gate field effect transistor 86 is coupled to ground.

The gate of the field effect transistor 80 is the positive input 48 of the voltage follower 34 and receives the reference voltage $REF_{LO}$, and the source terminal and gate of the insulated gate field effect transistor 82 are coupled together. The drain terminal and gate of the field effect transistor 84 are coupled together and together form the output 54 of the voltage follower 34. A control 90 includes an inverter 92 coupled to the gate of an insulated gate field effect transistor 94. The source terminal of the insulated gate field effect transistor 94 is coupled to the gate of the insulated gate field effect transistor 86 and to the gate of the insulated gate field effect transistor 82. The drain terminal of the insulated gate transistor 94 is coupled to ground. The input of the inverter 92 is the control input 52 of the voltage follower 34 and controls whether the voltage follower 34 is on or off.

The 1×, 10×, 12×, and 40× nomenclature used herein refers to the width of the corresponding device as compared to a standard which, in the case of the P channel portion of the CMOS process used to make the voltage follower 34, is 9 microns and, for the N channel, is 7 microns. Therefore, the width of the insulated gate field effect transistor 82 is 7 microns, the width of the field effect transistor 80 is 70 microns, the width of the insulated gate field effect transistor 86 is 108 microns, and the width of the field effect transistor 84 is 360 microns.

As indicated by FIG. 3, a copy of the detailed voltage follower shown therein may also be used as the voltage follower 38.

Figure 4:
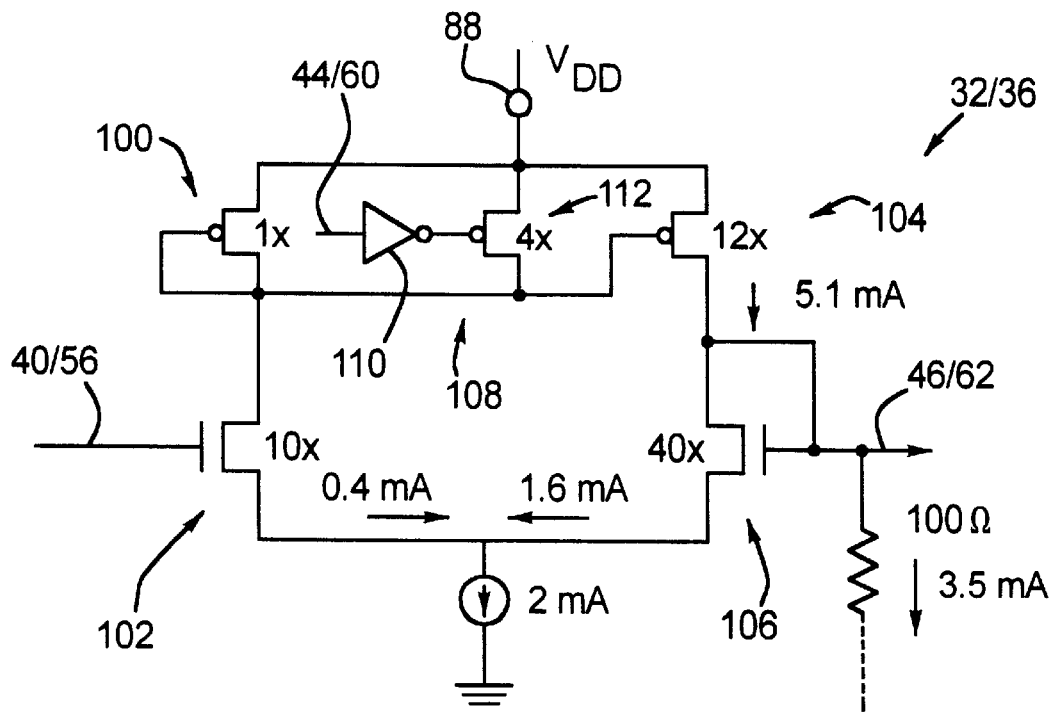

The voltage follower 32, which also may be implemented in CMOS, is shown in more detail in FIG. 4 and includes a field effect transistor 100 and an insulated gate field effect transistor 102 in the CMOS N channel and a field effect transistor 104 and an insulated gate field effect transistor 106 in the CMOS P channel. The source terminal of the field effect transistor 100 is coupled to the source 88, the drain terminal of the field effect transistor 100 is coupled to the source terminal of the insulated gate field effect transistor 102, and the drain terminal of the insulated gate field effect transistor 102 is coupled to ground. Similarly, the source terminal of the field effect transistor 104 is coupled to the source 88, the drain terminal of the field effect transistor 104 is coupled to the source terminal of the insulated gate field effect transistor 106, and the drain terminal of the insulated gate field effect transistor 106 is coupled to ground.

The gate of the insulated gate field effect transistor 102 is the positive input 40 of the voltage follower 32 and receives the reference voltage $REF_{HI}$. The drain terminal and gate of the field effect transistor 100 are coupled together. The source terminal and gate of the insulated gate field effect transistor 106 are coupled together and together form the output 46 of the voltage follower 32. A control 108 includes an inverter 110 coupled to the gate of a field effect transistor 112. The drain terminal of the field effect transistor 112 is coupled to the gate of the field effect transistor 104 and to the gate of the field effect transistor 100. The source terminal of the field effect transistor 112 is coupled to the source 88. The input of the inverter 110 is the control input 44 of the voltage follower 32 and controls whether the voltage follower 32 is on or off.

As indicated by FIG. 4, a copy of the detailed voltage follower shown therein may also be used as the voltage follower 36.

The currents illustrated in FIGS. 3 and 4 are by way of example only.

The output buffer 30 produces a high speed differential output voltage across the load 72.

Accordingly, when an input signal applied to the control inputs 44 and 68 turns the voltage followers 32 and 38 on, a corresponding inverted input applied to the control inputs 52 and 60 turns the voltage followers 34 and 36 off. Thus, the output 46 of the voltage follower 32 is at the reference voltage $REF_{HI}$ and the output 70 of the voltage follower 38 is at the reference voltage $REF_{LO}$ to provide a voltage drop across the load 72 substantially equal to $REF_{HI}$–$REF_{LO}$ so that current flows through the load 72 from the output 46 to the output 70.

On the other hand, when an input signal applied to the control inputs 52 and 60 turns the voltage followers 34 and 36 on, a corresponding inverted input applied to the control inputs 44 and 68 turns the voltage followers 32 and 38 off. Accordingly, the output 62 of the voltage follower 36 is at the reference voltage $REF_{HI}$ and the output 54 of the voltage follower 34 is at the reference voltage $REF_{LO}$ to provide a voltage drop across the load 72 substantially equal to $REF_{HI}$–$REF_{LO}$ so that current flows through the load 72 from the output 62 to the output 54.

Because of the use of the voltage followers 32, 34, 36, and 38, the current supplied by these voltage followers to charge the capacitor 76 can be higher than the current required for the prescribed voltage across the resistor 74. Thus, the charging current provided by the output buffer 30 is "active" in nature. In the case of a low voltage differential signal (LVDS) buffer, the current prescribed for the resistor 74 may be 3.5 ma but the current supplied by the voltage followers 32, 34, 36, and 38, unlike the current supplied by the output buffer 10, can be higher than 3.5 ma. Also, the use of the voltage followers 32, 34, 36, and 38 permit the use of internal reference voltages to set the upper and lower output voltages across the load 72 without relying directly on internal current sources or resistors to set the voltage swing across the load 72.

Figure 5:
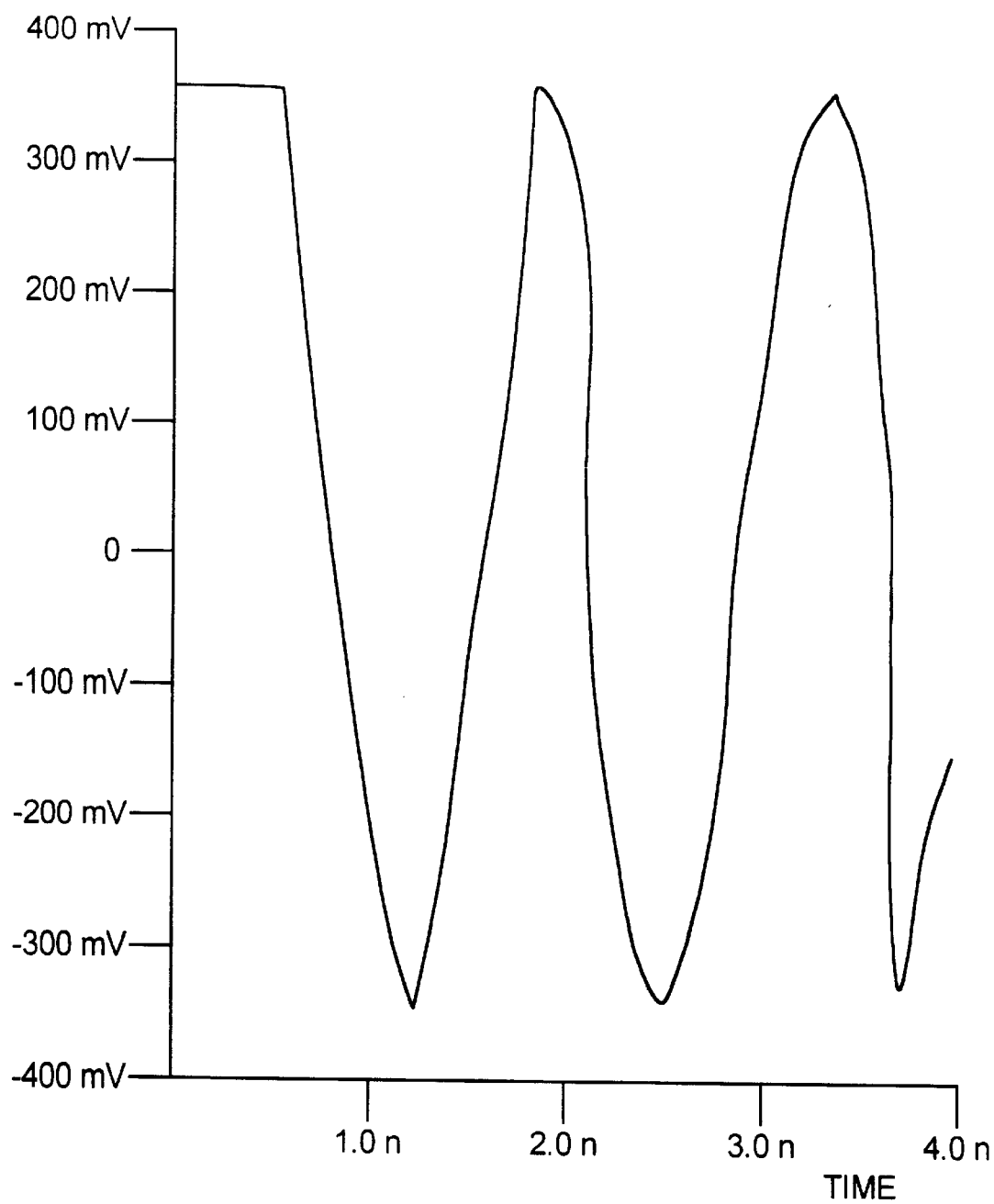
FIGS. 5 and 6 illustrate the performances of the output buffers of FIGS. 2 and 1, respectively.
Figure 6:
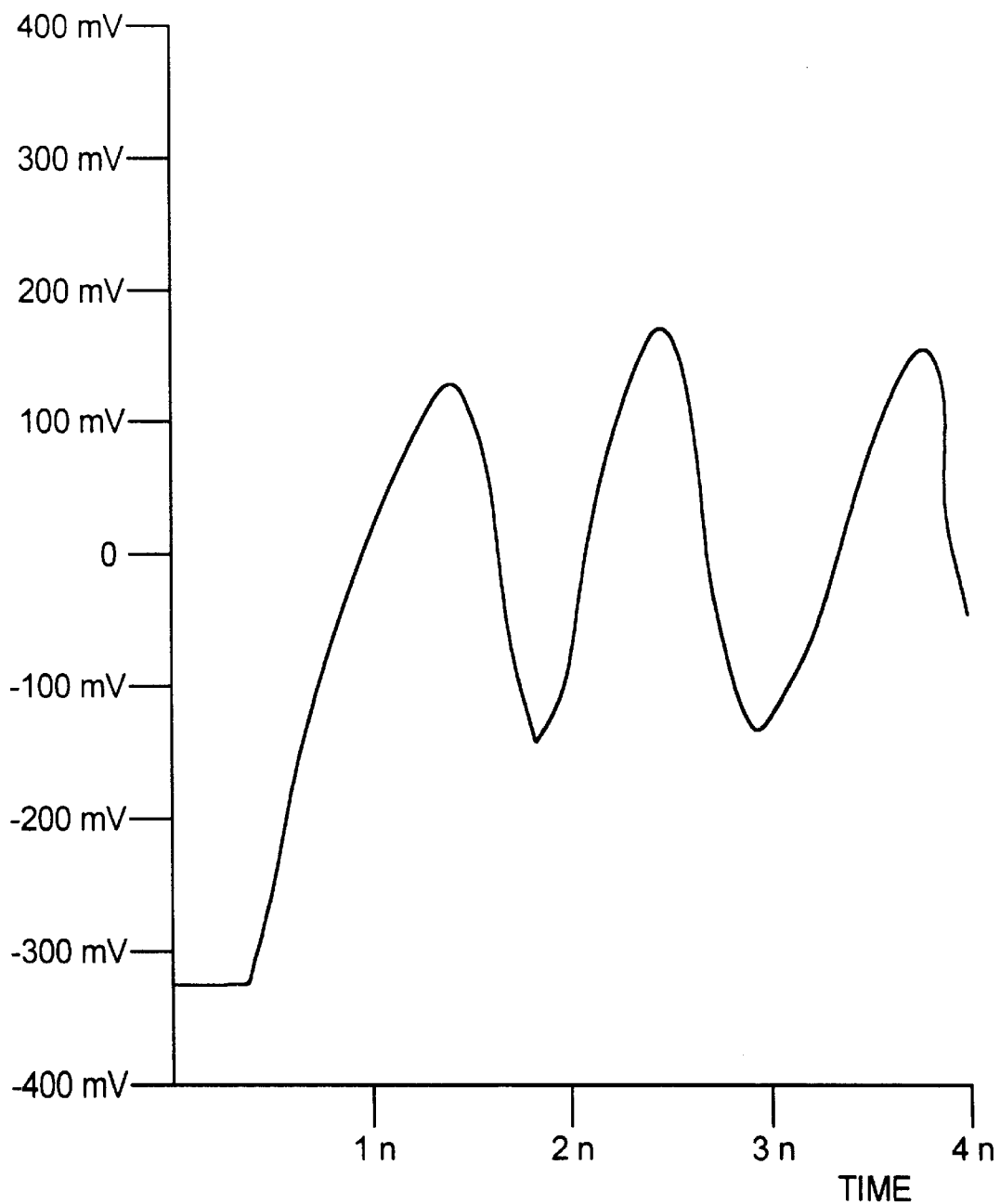

Moreover, a comparison of FIGS. 5 and 6 shows that the output buffer 30 permits higher speed operation than does the output buffer 10. FIG. 5 is a graph showing the voltage across the load 72 at a switching frequency of 800 MHZ and with the capacitor 76 set at 5 pf. FIG. 6 is a graph showing the voltage across the load 20 at the same frequency and the same capacitance for the capacitor 24. As shown in FIGS. 5 and 6, the voltage swing at 800 MHZ provided by the output buffer 30 is the desired 350 mV, but the voltage swing at 800 MHZ provided by the output buffer 10 is only about 160 mV.

Figure 7:
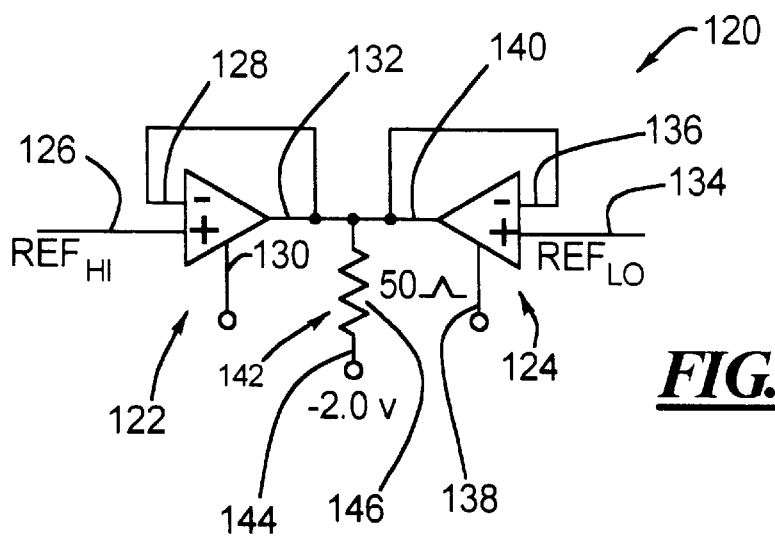
FIG. 7 is a schematic diagram of an output buffer using voltage followers according to a second exemplary embodiment of the present invention.

An output buffer 120 according to a second exemplary embodiment of the present invention is shown in FIG. 7 and may be used, for example, as an emitter-coupled logic (ECL) buffer. The output buffer 120 includes first and second voltage followers 122 and 124. The voltage follower 122 is shown in FIG. 7 as an amplifier having a positive input 126, a negative input 128, a control input 130, and an output 132. The positive input 126 receives a reference voltage $REF_{HI}$, the output 132 is coupled back to the negative input 128, and the control input 130 controls the on/off state of the voltage follower 122.

The voltage follower 124 is shown as an amplifier having a positive input 134, a negative input 136, a control input 138, and an output 140. The positive input 134 receives a reference voltage $REF_{LO}$, the output 140 is coupled back to the negative input 136, and the control input 138 controls the off/on state of the voltage follower 34.

The outputs 132 and 140 of the voltage followers 122 and 124 are coupled together and to one side of a load 142 the other side of which is coupled to a source 144. The source 144 is shown at negative polarity but instead may be at positive polarity. The reference voltages $REF_{HI}$ and $REF_{LO}$ may be reversed and may have any desired polarity. The load 142 includes a resistor 146 and may also include a capacitor (not shown). Loads other than the load 142 can be used with the output buffer 120.

The detailed voltage follower shown in FIG. 4 may be used for the voltage follower 122, and the detailed voltage follower shown in FIG. 3 may be used for the voltage follower 124. The output buffer 120 exhibits many of the advantages of the output buffer 30.

Figure 8:
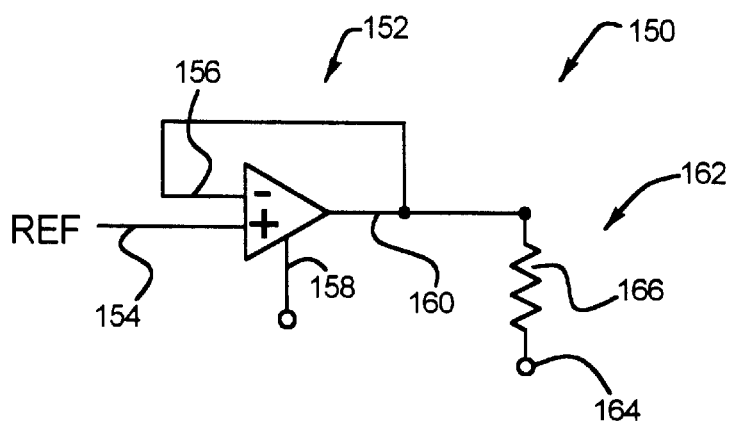
FIG. 8 is a schematic diagram of an output buffer using a voltage follower according to a third exemplary embodiment of the present invention; and, FIG. 9 is a schematic diagram of a voltage follower that can be used in the output buffers of the present invention and that is provided with electrostatic discharge protection.

An output buffer 150 according to a third exemplary embodiment of the present invention is shown in FIG. 8. The output buffer 150 includes a voltage follower 152. The voltage follower 152 is shown in FIG. 8 as an amplifier having a positive input 154, a negative input 156, a control input 158, and an output 160. The positive input 154 receives a reference voltage REF, the output 160 is coupled back to the negative input 156, and the control input 158 controls the on/off state of the voltage follower 152.

The output 160 of the voltage follower 152 is coupled to one side of a load 162 the other side of which is coupled to a source 164. The source 164 may be either at negative polarity or positive polarity as desired. The reference voltage REF may have any desired polarity. For example, the source 164 and the reference voltage REF may have opposite polarities, or the source 164 and the reference voltage REF may have the same polarity but may have different voltage levels. The load 162 includes a resistor 166 and may also include a capacitor (not shown). Loads other than the load 162 can be used with the output buffer 150.

The voltage follower shown in either FIG. 3 or FIG. 4 may be used for the voltage follower 152. The output buffer 150 exhibits many of the advantages of the output buffer 30.

One of the advantageous consequences of the output buffers described above is that, by using "active" voltage followers rather than a "passive" approach, the output nodes have less ringing when driving inductive loads or transmission lines. The reduced ringing results from the circuits tending to hold the output node voltages near their intended values after switching.

Figure 9:
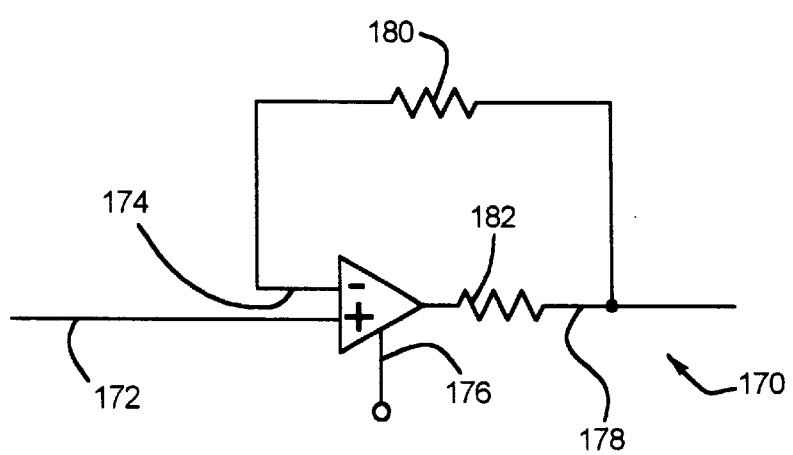

Certain modifications of the present invention have been discussed above. Other modifications will occur to those practicing in the art of the present invention. For example, if a CMOS process is used for any or all of the output buffers 30, 120, and 150, it may be desirable to protect the CMOS process against electrostatic discharge. One way to protect the CMOS process against electrostatic discharge is shown in FIG. 9, which illustrates a voltage follower 170 that can be used for any of the voltage followers used in the output buffers 30, 120, and/or 150. The voltage follower 170 has a positive input 172, a negative input 174, a control input 176, and an output 178. The positive input 172 receives a reference voltage, the output 178 is coupled back to the negative input 174, and the control input 176 controls the on/off state of the voltage follower 170. A first resistor 180 is provided in the feedback between the output 178 and the negative input 174, and a second resistor 182 is provided in the output 178. The resistors 180 and 182 protect the CMOS process in the voltage follower 170 against electrostatic discharge. Even with the resistors 180 and 182, the output voltage of the voltage follower 170 is still the reference voltage applied to the positive input 172.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. An output buffer comprising a voltage follower having a positive input, a negative input and an output coupled directly together, and a control input arranged to control an operational state of the voltage follower, wherein the positive input is a reference voltage input of the voltage follower, and wherein the output of the voltage follower is a load output of the voltage follower.

2. The output buffer of claim 1 wherein the voltage follower is turned on and off by the control input.

3. The output buffer of claim 1 further comprising a load, wherein the load is coupled between the output and a source.

4. The output buffer of claim 3 wherein the positive input receives a reference voltage, wherein the reference voltage has a polarity, and wherein the polarity of the reference voltage and the polarity of the source are opposite to one another.

5. The output buffer of claim 1 wherein the voltage follower is provided with electrostatic discharge protection.

6. The output buffer of claim 5 wherein the electrostatic discharge protection comprises first and second resistors, wherein the first resistor is coupled between the output and the negative input, and wherein the second resistor is coupled in the output.

7. An output buffer system comprising a voltage follower, a reference voltage, and a load, wherein the voltage follower has a positive input coupled to the reference voltage, a negative input and an output coupled directly together, and a control input arranged to control an operational state of the voltage follower, and wherein the output of the voltage follower is coupled to one side of the load.

8. An output buffer comprising a voltage follower having a positive input, a negative input and an output coupled together, and a control input arranged to control an operational state of the voltage follower, wherein the positive input is a reference voltage input of the voltage follower, wherein a load is coupled between the output and a source, wherein the reference voltage input comprises one of a positive voltage and a negative voltage, and wherein the source comprises the other of the positive voltage and the negative voltage.

* * * * *